(12) United States Patent
Abali et al.

(10) Patent No.: US 10,756,758 B1
(45) Date of Patent: Aug. 25, 2020

(54) LENGTH-LIMITED HUFFMAN ENCODING

(71) Applicant: INTERNATIONAL BUSINESS MACHINES CORPORATION, Armonk, NY (US)

(72) Inventors: Bulent Abali, Yorktown Heights, NY (US); Ashutosh Misra, Bangalore (IN); Matthias Klein, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/556,925

(22) Filed: Aug. 30, 2019

(51) Int. Cl.
H03M 7/40 (2006.01)
H03M 7/30 (2006.01)
G06F 9/50 (2006.01)

(52) U.S. Cl.
CPC ......... *H03M 7/405* (2013.01); *H03M 7/3077* (2013.01); *H03M 7/4062* (2013.01); *G06F 9/5027* (2013.01)

(58) Field of Classification Search
None
See application file for complete search history.

(56) References Cited

U.S. PATENT DOCUMENTS

| | | | |
|---|---|---|---|
| 6,690,306 B1 * | 2/2004 | Acharya | H03M 7/40 341/65 |
| 7,043,088 B2 | 5/2006 | Chiu et al. | |
| 7,403,136 B2 | 7/2008 | Cruz et al. | |
| 8,610,607 B2 | 12/2013 | Owsley et al. | |
| 9,419,647 B2 | 8/2016 | Gopal et al. | |
| 2015/0358031 A1 * | 12/2015 | Wu | H03M 7/6058 341/65 |
| 2019/0140658 A1 * | 5/2019 | Cooper | H03M 7/3088 |

OTHER PUBLICATIONS

Larmore et al., "A fast algorithm for optimal length-limited Huffman codes," Journal of the Association for Computing Machinery, (37)3, pp. 464-473, Jul. 1990 (Year: 1990).*

IPCOM000126029D; "Technique to Maximize the Run Length of Zeros, Suitble for Huffman Coding" Authors et. al.: Motorola Original Publication Date: Jun. 29, 2005 IP.com No. IPCOM000126029D IP.com Electronic Publication Date: Jun. 29, 2005 (9 Pages).

IPCOM000238109D; Hardware Compression Method With Early and Late Selection of Multiple Predefined Huffman Code Trees Authors et. al.: Disclosed Anonymously, IP.com Electronic Publication Date: Aug. 1, 2014 ( 4 Pages).

IPCOM000236473D; Method for Limiting the Number of Ideal Huffman Tree Encodings for Prospective Data Formats. Authors et. al.: Disclosed Anonymously, IP.com Electronic Publication Date: Apr. 29, 2014 ( 4 Pages).

Shodhganga et al; Optimal Length-Limited Huffman Codes (13 Pages).

Golin, M. et al; "A Dynamic Programming Approach to Length-Limited Huffman Coding" http://arxiv.org/abs/0806.4899v1 Jun. 30, 2008 (11 Pages).

* cited by examiner

*Primary Examiner* — Howard Williams
(74) *Attorney, Agent, or Firm* — Griffiths & Seaton PLLC

(57) ABSTRACT

Various embodiments are provided for length-limited Huffman encoding in a data compression accelerator in a computing environment by a processor. Symbol counts of a plurality of symbols in compressed data may be normalized and manipulated according to a maximum code length limiting operation such that those of the plurality of symbols having a least frequent symbol count have a symbol count equal to a maximum code length of a Huffman tree.

20 Claims, 10 Drawing Sheets

US 10,756,758 B1

LENGTH-LIMITED HUFFMAN ENCODING

BACKGROUND OF THE INVENTION

Field of the Invention

The present invention relates in general to computing systems, and more particularly to, various embodiments for providing length-limited Huffman encoding using one or more computing processors.

Description of the Related Art

In today's society, computer systems are commonplace. Computer systems may be found in the workplace, at home, or at school. Computer systems may include data storage systems, or disk storage systems, to process and store data. In recent years, both software and hardware technologies have experienced amazing advancement. Processing devices, with the advent and further miniaturization of integrated circuits, have made it possible to be integrated into a wide variety of devices. In recent years, both software and hardware technologies have experienced amazing advancement. With the new technology, more and more functions are added, and greater convenience is provided for use with these computing systems.

SUMMARY OF THE INVENTION

Various embodiments for providing length-limited Huffman encoding in a data compression accelerator by a processor are provided. Symbol counts of a plurality of symbols in compressed data may be normalized and manipulated according to a maximum code length limiting operation such that those of the plurality of symbols having a least frequent symbol count have a symbol count equal to a maximum code length of a Huffman tree.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE DRAWINGS

Figure 1:
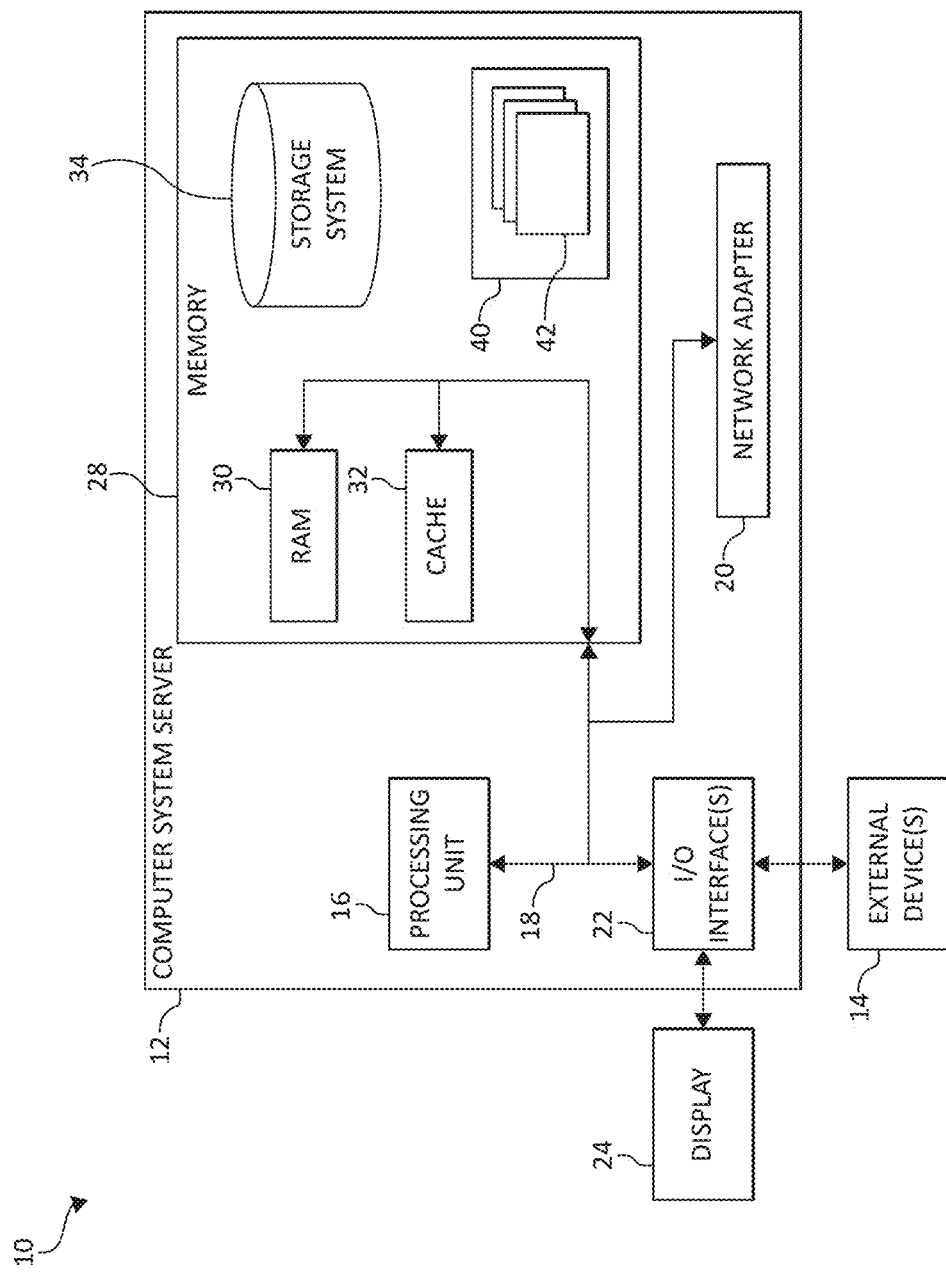
FIG. 1 is a block diagram depicting an exemplary cloud computing node according to an embodiment of the present invention.

Generally, electronic circuits have significant data storage capacities. Such capacities may be achieved with large memories formed of several memory blocks for physical or logical reasons. For example, such memories may include SRAM (Static Random-Access Memory) or DRAM (Dynamic Access Memory). A memory controller enables the other functions of the electronic circuit to view all the memory blocks as a single memory, in terms of address.

Additionally, many hardware and software applications use data compression to reduce memory and memory capacity and to reduce network and input/output ("I/O") bandwidth. Data storage systems commonly employ data compression to increase the effective storage capacity of the physical storage media within the data storage system. One common data compression technique employed is dynamic Huffman compression. For example, a data compressor that employs a dynamic Huffman compression architecture encodes input data blocks (also referred to herein as "data pages") utilizing, for example, in the DEFLATE compliant data compressors, a Lempel-Ziv77 ("LZ77") encoder, extracts an optimal Huffman code for each LZ77-encoded data page, and then encodes each LZ77-encoded data page utilizing the optimal Huffman code for that data page to obtain compressed output data. The outputs of a dynamic Huffman compressor include the compressed output data and a code description of the optimal Huffman code utilized to encode each data page.

Thus, Huffman coding is often used to compress data, such as the DEFLATE standard (colloquially referred to as "GZIP"). Huffman codes are variable-length codes in which the most common data elements are coded with fewer bits. Dynamic Huffman codes are customized codes that are spontaneously generated based on the frequency of data elements. Said differently, a Huffman code is an optimal prefix code found using an algorithm. More common symbols are typically represented using fewer bits than less common symbols. That is, the Huffman encoding may form a set of symbols based on frequency of use. Each set of symbols may be assigned a corresponding set of codes that have the same number of bits. In this way, a Huffman tree may be built (e.g., a binary tree of nodes).

However, due to the hardware limitations in terms of capacity and silicon area, the DEFLATE industry standard specifies that no more than 15 bits may be used for the largest codeword, which also results in a restriction requirement of limiting the number symbols in each set based on capacity. Thus, if capacity and industry standard limits are exceeded, then the symbols may be adjusted down into the shorter codewords, where space is available, to reduce the size of the largest codes and to reduce any overflow in a single group.

Accordingly, the present invention provides a solution to provide length-limited Huffman encoding in a data compression accelerator in a mainframe computing system. Symbol counts of a plurality of symbols in compressed data may be normalized and manipulated according to a maximum code length limiting operation such that those of the plurality of symbols having a least frequent symbol count may have a code length not exceeding the maximum code length of 15 bits.

In an additional aspect, the present invention provides for length-limited Huffman encoding in a data compression accelerator in mainframe system. Length-limited Huffman code tables may be implemented and/or created. An integer arithmetic operation may be used for limiting a bit length of one or more Huffman codes (e.g., 15 bits) as required by Industry compression standards. A parallelized length-limited Huffman operation may be used that reduces the time complexity of producing an N size code table from O(N log N) to O(N+N½ log N½). Basic Huffman operation requires sorting symbols by their frequency of occurrence. Without parallelization the sorting step slows down the compression operation. With parallelization the entire length limited Huffman encoding operation is completed in 1.6 microseconds which is less than 10% of the entire compression operation.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, system memory 28 may include at least one program product having a set (e.g., at least one) of program modules that are configured to carry out the functions of embodiments of the invention.

Program/utility 40, having a set (at least one) of program modules 42, may be stored in system memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
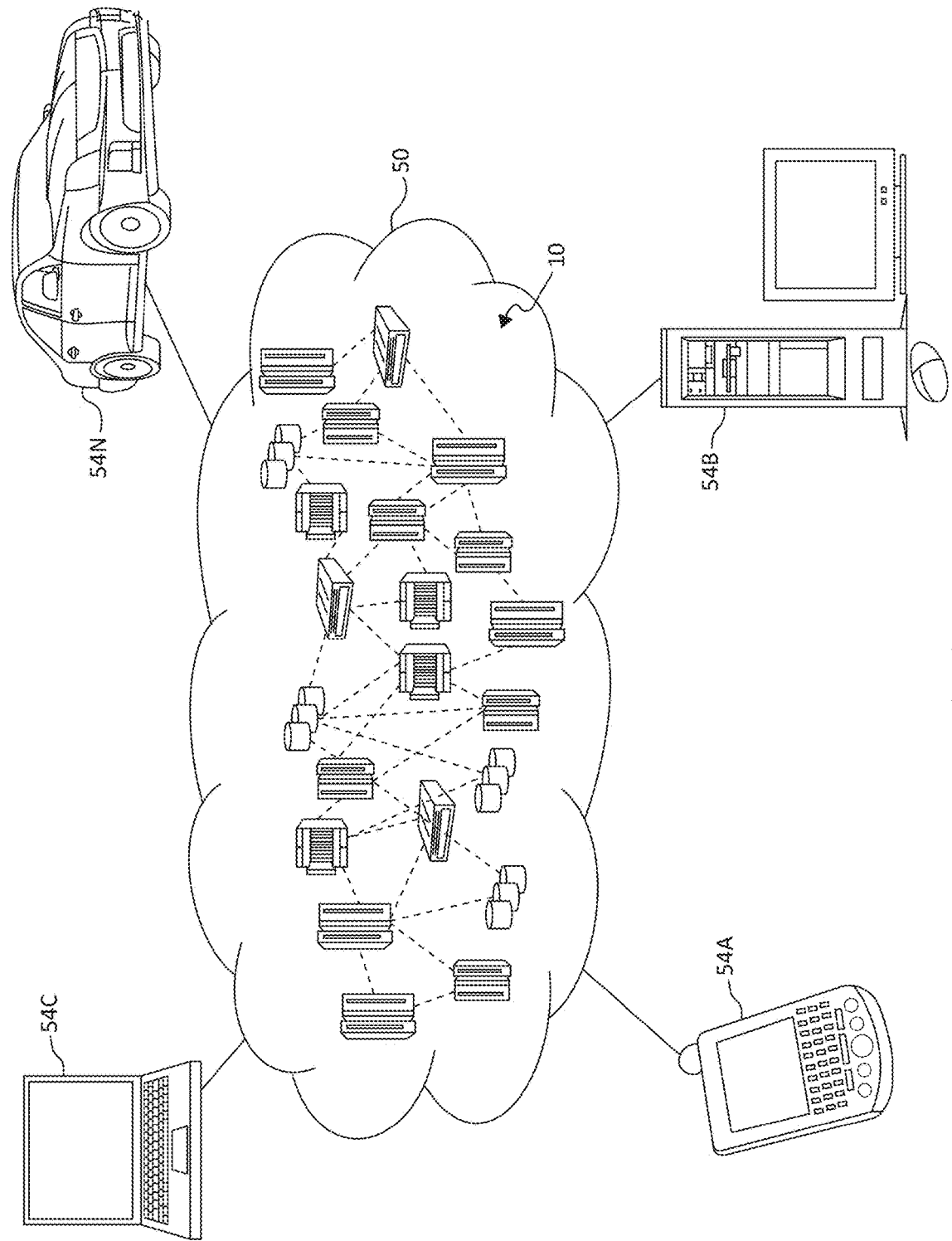
FIG. 2 is an additional block diagram depicting an exemplary cloud computing environment according to an embodiment of the present invention.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
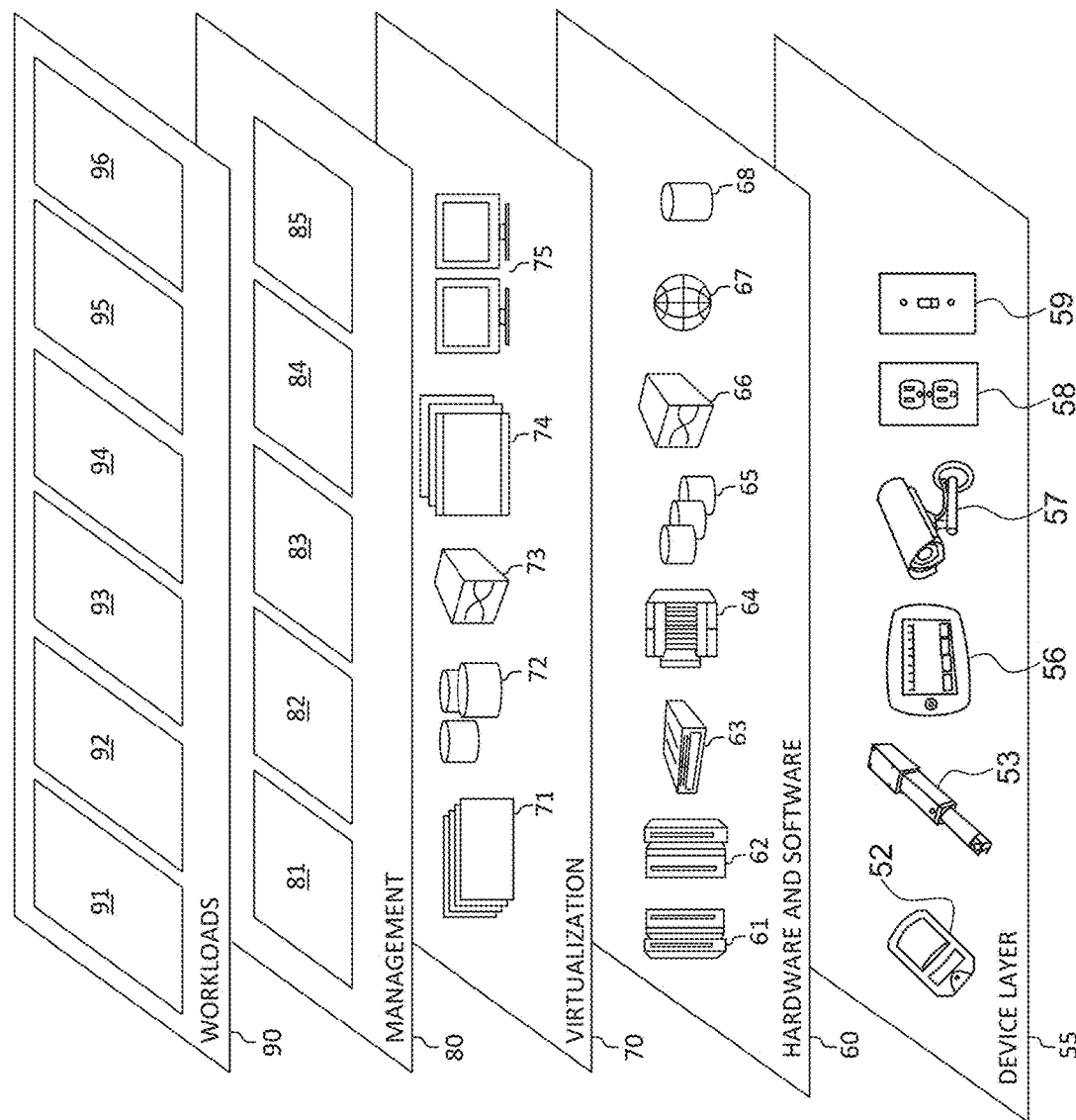
FIG. 3 is an additional block diagram depicting abstraction model layers according to an embodiment of the present invention.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Device layer 55 includes physical and/or virtual devices, embedded with and/or standalone electronics, sensors, actuators, and other objects to perform various tasks in a cloud computing environment 50. Each of the devices in the device layer 55 incorporates networking capability to other functional abstraction layers such that information obtained from the devices may be provided thereto, and/or information from the other abstraction layers may be provided to the devices. In one embodiment, the various devices inclusive of the device layer 55 may incorporate a network of entities collectively known as the "internet of things" (IoT). Such a network of entities allows for intercommunication, collection, and dissemination of data to accomplish a great variety of purposes, as one of ordinary skill in the art will appreciate.

Device layer 55 as shown includes sensor 52, actuator 53, "learning" thermostat 56 with integrated processing, sensor, and networking electronics, camera 57, controllable household outlet/receptacle 58, and controllable electrical switch 59 as shown. Other possible devices may include, but are not limited to various additional sensor devices, networking devices, electronics devices (such as a remote control device), additional actuator devices, so called "smart" appliances such as a refrigerator or washer/dryer, and a wide variety of other possible interconnected objects.

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provides cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provides pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and, in the context of the illustrated embodiments of the present invention, various workloads and functions 96 for providing length-limited Huffman encoding in a computing environment. In addition, workloads and functions 96 for providing length-limited Huffman encoding in a computing environment may include such operations as data analysis (including data collection and processing from various environmental sensors) and/or analytics operations. One of ordinary skill in the art will appreciate that the workloads and functions 96 for providing length-limited Huffman encoding in a computing environment may also work in conjunction with other portions of the various abstractions layers, such as those in hardware and software 60, virtualization 70, management 80, and other workloads 90 (such as data analytics processing 94, for example) to accomplish the various purposes of the illustrated embodiments of the present invention.

Figure 4A:
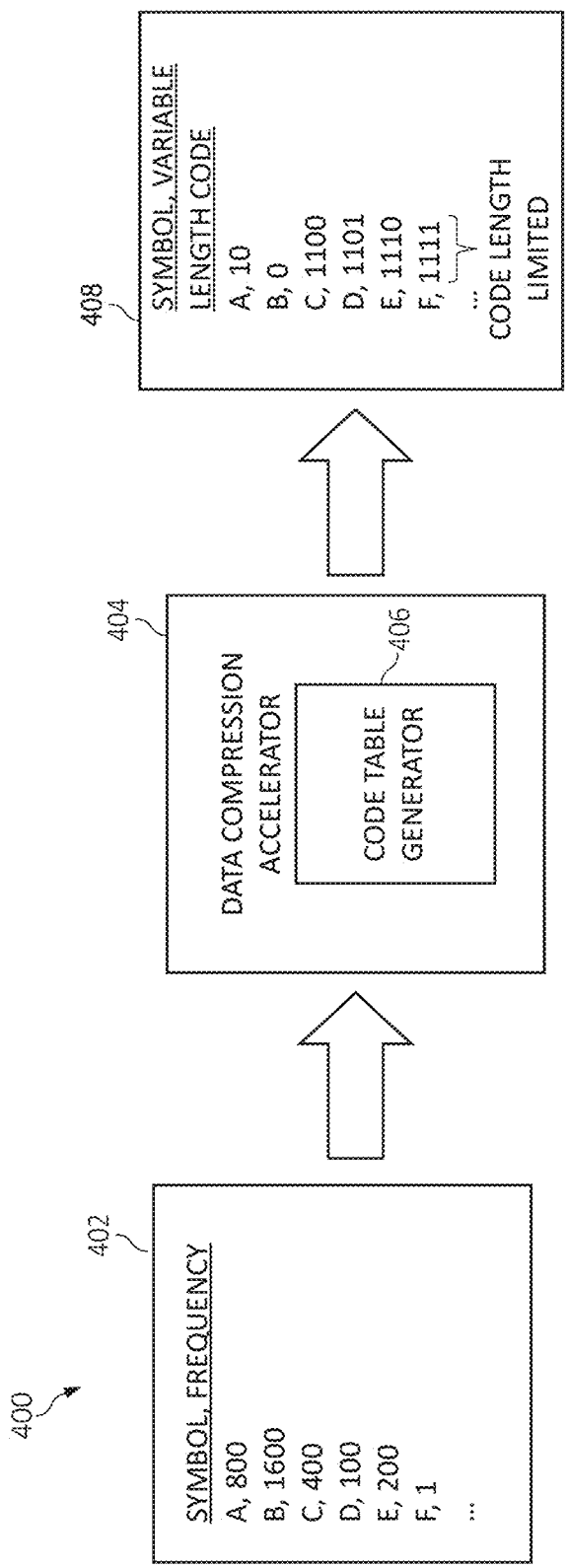
FIG. 4A-4B is a diagram depicting Huffman tree with length-limited Huffman encoding in which aspects of the present invention may be realized.
Figure 4B:
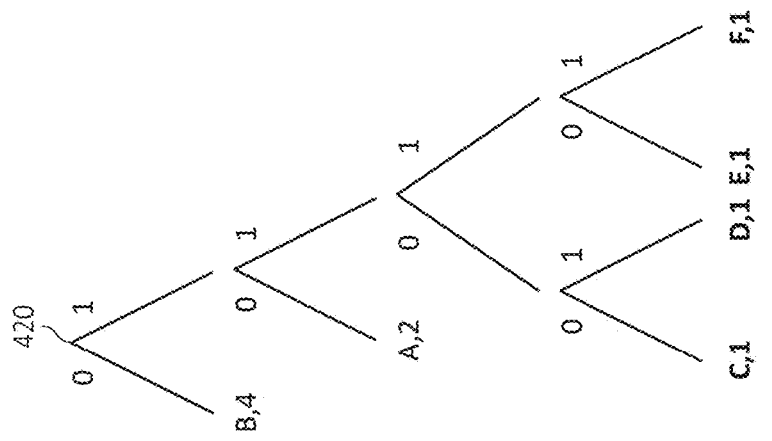
Figure 4B:
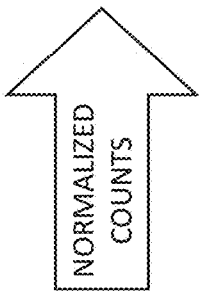
Figure 4B:
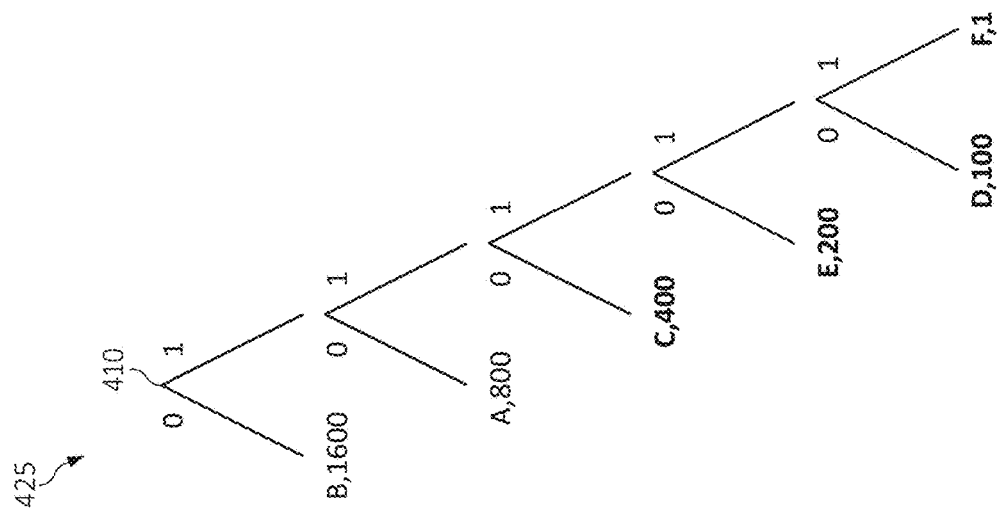

As previously mentioned, the mechanisms of the illustrated embodiments provide novel approaches for providing length-limited Huffman encoding in a computing environment. Turning now to FIGS. 4A-4B, diagrams 400 and 425 depict Huffman tree with length-limited Huffman encoding. In one aspect, one or more of the components, modules, services, applications, and/or functions described in FIGS. 1-3 may be used in FIG. 4. For example, the system 400 may be components internal and/or external to computer system/server 12 (e.g., a mainframe computing system).

For example, as illustrated in FIG. 4A, a data compression accelerator 404 may include a code table generator 406, each of which may be internal and/or external to computer system/server 12 (e.g., a mainframe computing system). In operation, assume a source file 402 is to be compressed and includes letters A, B, C, D, E, and F which occur 100, 800, 400, 200, 100, and 1 times, respectively.

In the Huffman encoding scheme, the symbols (i.e., the literals and the other LZ77 characters) may be represented with variable length codes. Frequent symbols may be assigned shorter codes, therefore resulting in a smaller file when compared to encoding them with the identical number of bits such as, for example, 8 bits when using raw bytes. Thus, the code table generator 406 may collect, determine, and/or count both the symbol and frequency of the symbol ("symbol/frequency), and produce a Huffman code table 408 quickly and algorithmically in real time. The code lengths may be limited to a specified maximum (e.g., 15 bits for the Deflate standard).

More specifically, turning now to FIG. 4B, to determine which symbol gets which code, the Huffman encoding builds a Huffman tree such as, for example, Huffman tree 410 which is inverted in FIG. 4B, where to root is at the top of the page. That is, the Huffman encoding builds a tree where the path from the root to the leaves are the coded words assigned to each symbol. The symbols A-F, for example, may be assigned to the leaves of the tree and their depth from the root is determined by their probability. It should be noted that the most frequent symbol B is closest to the tree root whereas the least frequent symbols D and F are farthest from the root.

In one aspect, the shape of the Huffman tree 410 changes according to the probability distribution of the symbols. Frequent symbols may be assigned to the shorter branches of the tree and infrequent symbols may be assigned to the longer branches of the tree according to the Huffman encoding operation. Thus, data compression is achieved due to the fact that frequent symbols are assigned fewer codeword bits hence take up less space in the compressed data stream. Once the Huffman tree 410 is built, the variable length code for each symbol A-F is obtained by traversing the tree from root to the leaf, assuming a left branch is a '0' and the right branch is a '1'. For example, B is the most frequent symbol in Huffman tree 410 (1600 times) and accordingly is assigned the 1 bit codeword '0'. F is the least frequent symbol and accordingly is assigned the 5 bit codeword '11111'.

As noted, the Huffman encoding operation uses binary comparisons for building the Huffman tree 410. Normalizing the symbol counts do not change the result if a normalization operation is applied equally to all counts. For example, dividing all the symbol counts equally by 2, does not change the relative order of symbols in the Huffman tree. However, the Huffman tree shape (e.g., the maximum depth) may be changed by unequally manipulating the frequencies (counts) of the symbols, as depicted in Huffman Tree 420. For example, if the symbol counts of the lower probability items (e.g., D and F) are artificially increased, the Huffman tree shape may change. For example, assume there is a need to limit the depth to 4. If the counts are normalized however unequally with an integer division such as, for example, by a factor of 400 (e.g., "NewFreq=CEILING(OldFreq/400"), the lower probability items D, E, F have their normalized counts artificially increased relative to the other symbols, where "Freq" is frequency of the symbol counts. For example, in the original Huffman tree 410 the ratio of counts of B/E, B/D, B/F are 1600/200=8, 1600/100=16, and 1600/1=1600, respectively. Whereas, with the unequal normalization using the formula above, the ratio of B/E, B/D, B/F counts are now 4/1=4, 4/1=4, 4/1=4, respectively. The Huffman Tree 420 depth, when processed through the Huffman algorithm, limits the tree depth to 4 according to the new probabilities (where symbols C, D, E, and F are limited at the final depth of 4).

At the same time, the more frequent symbols with higher counts, for example, A and B preserve their locations in the tree therefore compressibility is relatively unchanged. Whereas the infrequent symbols with small counts are pushed up to new locations therefore limiting the depth.

Accordingly, symbol counts of the symbols in compressed data may be normalized and manipulated according to a maximum code length limiting operation such that those of the plurality of symbols having a least frequent symbol count have a symbol count equal to a maximum code length of a Huffman tree for providing length-limited Huffman encoding in a data compression accelerator 404.

Said differently, the maximum code length limiting operation for the length limiting may be defined as predicting the maximum code length using the maximum code length limiting equation:

$$\text{Huffman Tree Depth} = -\log_2(\text{minimum probability}) \quad (1),$$

where the minimum probability is for a least frequent symbol. To further illustrate the operations of $-\log_2$ (minimum probability), consider the Huffman tree 410 where symbols D has a symbol count of 100 and F has a symbol count of 1 and are the least probable symbols. The total count of the symbols A-F is 1600, 800, 400, 200, 100, and 1 which is equal to 3101. Therefore, the minimum probability is obtained by dividing the smallest count with the total count (e.g., 1/3101).

Equation 1 may be reorganized by taking reciprocal of the inner division and eliminating the "minus" as illustrated in the following equation:

$$\text{Huffman Tree Depth} = \log_2\left(\frac{1}{\text{minimum probability}}\right) = \log_2\left(\frac{\text{Total Count}}{\text{Smallest Count}}\right), \quad (2)$$

Then the maximum tree depth may be set to 15 (e.g., 15 bits required by some computing industry standards) where:

$$15 \geq \log_2\left(\frac{\text{Total Count}}{\text{Smallest Count}}\right), \quad (3)$$

However, if at any point in time the maximum depth of the Huffman Tree Depth exceeds 15, the following equation (e.g., an integer division normalizing operation) may be implemented and used (e.g., iteratively applying equation 4 following an execution of the Huffman encoding operation):

$$\text{Count}[S] := (\text{Count}[S]+1)/2 \quad (4),$$

Therefore, to limit the length of the Huffman tree 420 to 15 bits, the total symbol count (e.g., Total Count) and the smallest symbol count (e.g., Smallest Count) may be manipulated until the required Huffman Tree Depth condition above is satisfied. The repeated division by the value of 2 (e.g., the integer division normalizing operation or equation 4), while not allowing the non-zero counts to go to 0, enables satisfying the required Huffman Tree Depth condition. The present invention enables maintaining the tree shape for the most frequent counts (e.g., the higher symbol counts) which dividing by 2 achieves. The most frequent counts (e.g., the higher symbol counts) proportion to each other (i.e., probability) do not change significantly dividing by 2. However, for the smaller counts which matters less in terms of compression ratio, as the counts approach 0, the present invention may force the smaller counts to remain at 1, therefore pushing them up from very deep parts of the Huffman tree to branches closer to the root at the length-limited depth of 15.

Thus, normalizing and manipulating the symbol counts of a plurality of symbols in compressed data according to the maximum code length limiting operation (e.g., the maximum code length limiting equation) may include rearranging the maximum code length limiting equation to equation 4, above, such that the least probable item's probability becomes 15 (e.g., 1/32768 from the example above. That is, using the example above, the maximum code length limiting equation may be redefined to predict a maximum depth according to the equation:

$$\text{MIN}(-\log_2(\text{Lowest Probability}), N-1), \quad (5),$$

where N is the number of symbols, (N−1) is a corner case which occurs only for a small number of symbols), if the number of symbols is 16 or less the maximum code length cannot exceed 15 in the worst case (e.g., there is no tree shape for 16 symbols deeper than 15). Therefore, the symbol counts may be normalized and manipulated such that the lowest probability satisfies the required Huffman Tree Depth condition such as, for example, 1/32768=15 (e.g., 15 bits). Thus, normalizing the counts using equation 4 estimates the least probable item's probability. For example, suppose the least probable item's probability is 1/1,000,000, one in a million in the unlimited depth tree case. Applying equation 5, yields the arrival at a depth estimate of $-\log_2$(Lowest 0.000001)=19.9, which exceeds the DEFLATE standard limit of 15. Accordingly, the tree depth must be limited by applying our normalization rules. By repeatedly applying equation 4, above, to all the symbol counts including those not shown (noting that division is an integer division which drops fractions) such as 1000000/2+1=5,000,001, then 5000001/2+1=250,001, then 250,001/2+1=125,001, then 125,001/2+1=62501, then 62501/2+1=31251, and thus arriving at the new normalized count 31251. It should be noted that $-\log_2 1/31251$ equals 14.9 bits. As such, the maximum depth of this new "normalized" tree is estimated to be 14.9 bits which is less than the required 15.

Thus, in summary, in a first step, the maximum code length limiting equation (e.g., integer division operation) may be executed for normalization and manipulation for length-limiting Huffman encoding. In a second step, the Huffman encoding may be executed. In step 3, if the maximum depth 15 is exceeded, for symbol "S" in all symbols, the maximum code length limiting equation may be executed (e.g., iteratively executed until satisfying the required Huffman Tree Depth condition). In step 4, if the maximum depth is not exceeded (e.g., the required Huffman Tree Depth condition is satisfied), the maximum code length limiting equation and Huffman encoding is terminated.

Figure 5:
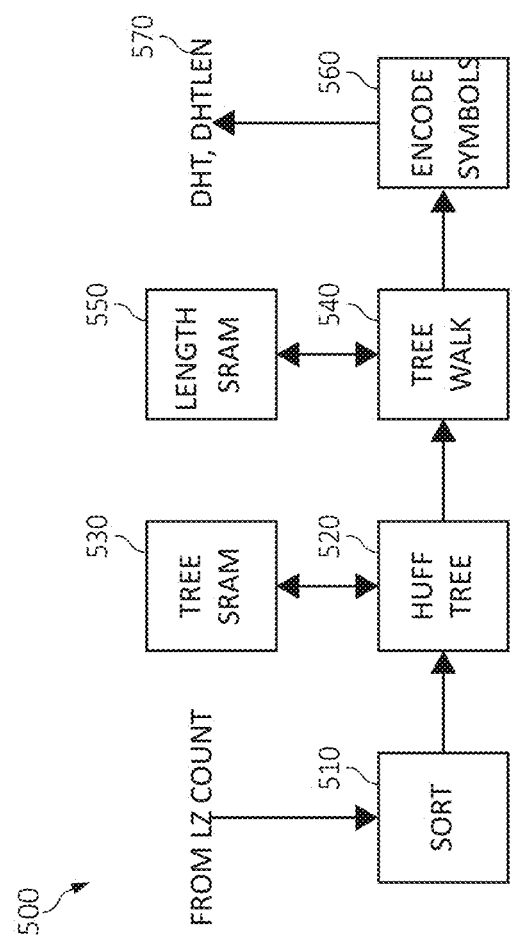
FIG. 5 is an additional block diagram depicting Huffman code table production operation for length-limited Huffman encoding in which aspects of the present invention may be realized.

Turning now to FIG. 5, diagram 500 depicts Huffman code table production operation (e.g., Huffman code table flow) for length-limited Huffman encoding. In one aspect, one or more of the components, modules, services, applications, and/or functions described in FIGS. 1-4A-4B may be used in FIG. 5. Repetitive description of like elements, components, modules, services, applications, and/or functions employed in other embodiments described herein (e.g., FIGS. 1-4) is omitted for sake of brevity.

In one aspect, the basic Huffman code table production operations execute in time proportional to O(N log N). In another aspect, an O(N) operation may be used for Huffman encoding if the symbol counts are pre-sorted. Therefore, the present invention provides for performing a parallel sort (e.g., parallelized the SORT operation) using a two-dimensional ("2D") shear sort operation, which runs in $O(N^{1/2} \log N^{1/2})$ time, as further depicted in FIGS. 6A-6C.

Starting in block 510, the sort operation may read one or more values from LZ count arrays where a count is read one at a time, by first reading and sorting the symbols by count. In block 520, the Huffman Tree creates a code tree (see FIG. 4B) in tabular form in an SRAM array of one or more entries, as in block 530. To further illustrate, once the (symbol, count) pairs are sorted, the Huffman Tree, of block 520, starts reading symbol/count pairs starting with the lowest count pair. The symbol/count pair is considered a "leaf" of the Huffman Tree. The smallest two pairs are combined together, their counts are summed, and the resulting "internal tree" node is entered into the Tree SRAM depicted in block 530 of FIG. 5. The Tree SRAM may be organized as a queue with head and tail pointers. It should be noted that the queue may be sized so that it never wraps. At this point, an operation may be executed to examine the front of both the 2D mesh and the Tree SRAM and the lowest two count elements may be selected from either of two structures, by summing their counts and appending to the end of the Tree SRAM.

In block 540, the Tree Walk operation scans the Huffman Tree structure stored in the first SRAM (in block 530), and assigns code lengths of 0 to 15 bits to each symbol. Once the Tree SRAM, of block 540, is populated with the Huffman tree data structure, the Tree Walk operation may start searching the Tree SRAM starting with the root and following the left and right fields. Starting with the root of the tree (as shown in FIG. 4B), traverse the branches of the tree and recording the 0/1 label of the branch. Once reaching a leaf the recorded sequence of labels becomes the binary code word. For example in FIG. 4B (right or Huffman tree 420), root to symbol C traverses (walks) the branches labelled 1,1,0,0 and accordingly the binary codeword for symbol C becomes 1100.

The Tree Walk, of block 540, may also write the code lengths to a second SRAM, as in block 550 (e.g., the length ("LEN") SRAM). The length SRAM contains the code length of each symbol. In the example of FIG. 4B (right or Huffman tree 420), the symbol C's code length is 4 bits. That is, each time the Tree Walk may be called/executed, the Huffman Tree depth may be incremented by 1. Subsequently, a symbol's depth (i.e., the distance from the root) may be determined and written to the LEN SRAM, as in block 550. The second SRAM may have one or locations. The second SRAMs may be indexed by symbols and stores code lengths 0 to 15.

Finally, in the Encode SYMBOLS, in block 560, may compact the list of encoded symbols and their Huffman codewords. The compacted values may then be stored in the dynamic Huffman table ("DHT"), as in block 570.

Figure 6A:
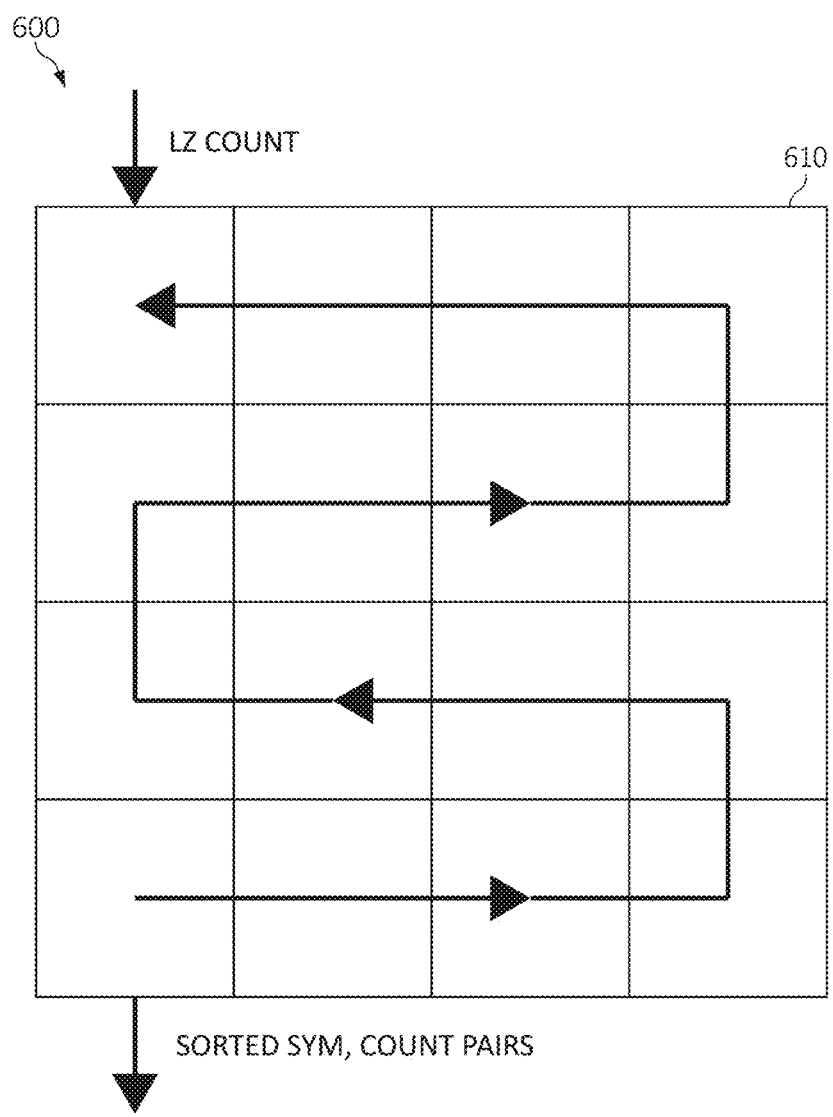
FIG. 6A-6C is an additional block diagram depicting sorting operations for length-limited Huffman encoding in which aspects of the present invention may be realized.
Figure 6B:
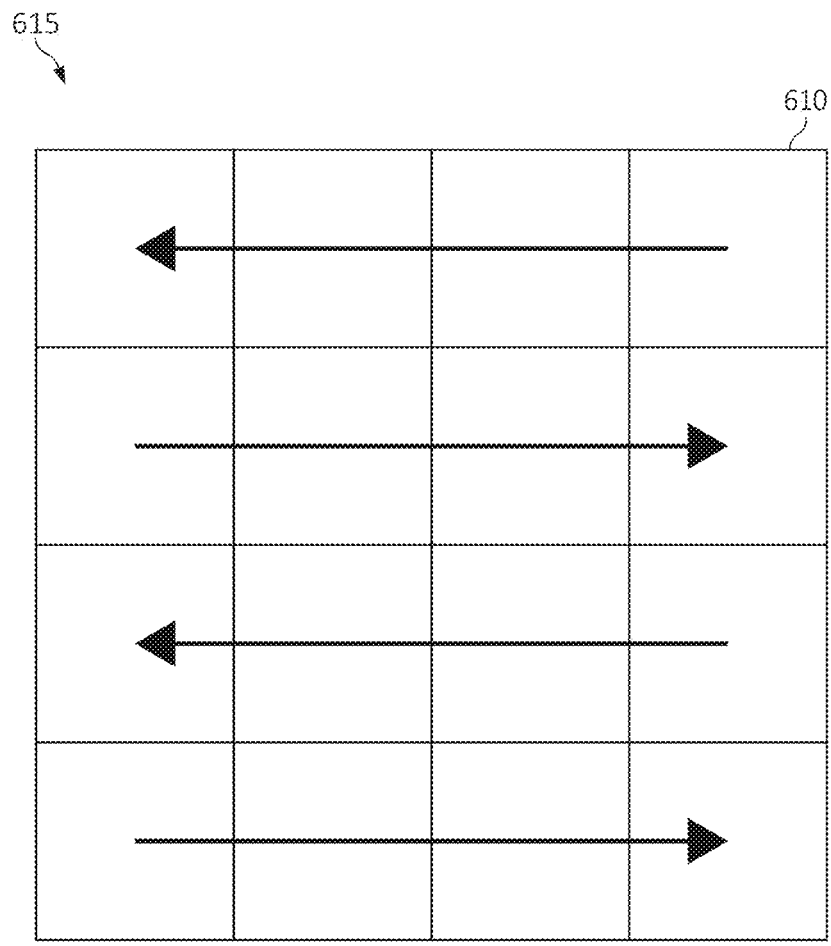
Figure 6C:
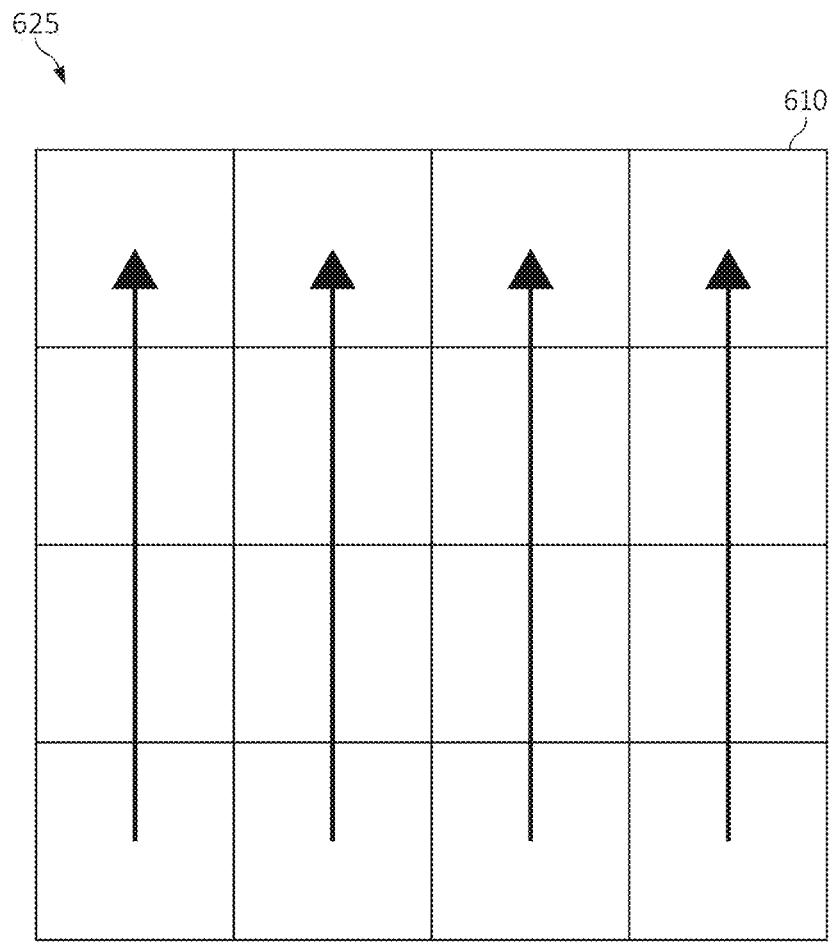

In one aspect, the sort operation of block 510 may be performed using a sort block, as illustrated in FIGS. 6A-6C. In one aspect, a sort Block may be a two dimensional mesh (e.g., N×M=18×16 or 17×17 table block of column or rows, etc.) mesh that stores pairs of symbols and counts (e.g., symbol/count pairs). In operation, the sort operation of block 510 may include the following steps. In step 1), LZ count arrays may be read and the symbol/count pairs may be shifted in to the 2D mesh. In step 2), all zero counts may be changed (optionally if needed) to 1 if a control input is asserted. This step may be used when a codeword for a missing symbol needs to be generated regardless (e.g. those with zero counts) By changing all zero counts to the smallest possible count of 1, the operation is forced to produce a codeword for every symbol. In step 3), the total count (e.g., a total bit count such as for example 24 bit counts) may be counted and stored in a register while sequentially reading the LZ counts. In step 4), all stored counts may be divided by 2 in parallel according to the formula of equations 4. In step 5), the symbol/count pairs may be sorted in parallel with count field being the sort key. In one aspect, a 2D shear sort algorithm may be used.

It should be noted the Huffman encoding operation has an O(n log n) time, which is the most time consuming step, but using the parallelizing sort operation in step 4, the time is reduced. Also, step 2 is for making a universal Huffman code table for generating codes for every possible symbol including with zero counts. Steps 3 and 4 may be for limiting the maximum code length to 15 bits (e.g., length-limited Huffman coding).

Turning now to FIGS. 6A-6B, the objective of the sorting operation is to sort the pairs of symbols and counts (e.g., symbol/count pairs) in the 2D mesh in ascending order (e.g., in a serpentine or "S-shape" as in FIG. 6A), where the rows are sorted in an intermediate sort operation (see FIG. 6B), and the columns are sorted in an intermediate sort (see FIG. 6C).

To further illustrate the operations illustrated in FIGS. 6A-6C, consider the following. In one aspect, each pair of symbols and counts (e.g., symbol/count pair) is stored in a square in the 2D mesh. The sorting operation result is a serpentine sorted order as shown in FIG. 6A where the arrow indicates the direction of the sort.

Each row is sorted using the Odd-Even sort algorithm shown below. Each row should complete in N cycles where N is the number of elements in the row (e.g. N=16). The bottom row being row 0, even rows are sorted in ascending order left to right. Odd rows may be sorted in descending order left-to-right, as depicted in FIG. 6B.

Each column may be sorted using an Odd-Even operation in M cycles. In one aspect, the columns of the 2D mesh may be sorted all in the same direction such as, for example, ascending towards the top as depicted in FIG. 6C. Also, steps 1-2 of the sorting operation, as mentioned above, are repeated ($\log_2 N$)+1 times and the entire 2D mesh may sorted in snake-like order (see FIG. 6A).

In one aspect, for the odd-even sort operation sub-routine of the shear sort, if a linear array of N numbers are provided (e.g., where K=0, 1, . . . , N−1) the following may be performed in parallel. In the even cycles, pairs of array locations such as, for example, (0,1), and (2,3), and . . . (N−2,N−1) may exchange their numbers in the chosen ascending sort direction to the left or to the right. In the odd cycles, the pairs of array locations such as, for example, (1, 2) and (3, 4), and . . . (N−3, N−2) may exchange their numbers in the chosen ascending sort direction to the left or to the right. For example, suppose a list of unsorted numbers are provided such as, for 4, 7, 8, 3, 2, 9 to be sorted in ascending order left-to-right. The odd-even sort is named as such because in each odd and even numbered step the pairs of values are compared and exchanged with their right or left neighbor in a bucket brigade fashion. In one aspect, the pairs connected with dashes may be compared and exchanged as a result of the comparison result moving smaller values to the left hand side and larger values to the right hand side, such as, for example, 4-7 8-3 2-9 may be compared in the odd numbered step (step 1), resulting in a new order 4 7 3 8 2 9. Now in the second step 2 (even numbered step), the pairs connected with dashes 4 7-3 8-2 9 are compared while leaving the two end points alone resulting in the sequence 4 3 7 2 8 9. Now in the 3rd (odd) step the pairs in the same position the $1^{st}$ step, now 4-3 7-2 8-9 are compared even resulting in the new sequence, 3 4 2 7 8 9. In the $4^{th}$ step, the sequence 3 4-2 7-8 9 pairs are compared resulting in the sequence 3 2 4 7 8 9. Then in the 5th step, 3-2 4-7 8-9 are compared and exchanged, resulting in the sequence 2 3 4 7 8 9 and the sort operation completed.

In one aspect, when determining when to stop sorting, the present invention may perform a logical OR of the ("exchanged" signals) coming from each cell of the 2D mesh to determine when to stop sorting. When the serpentine like sorted order is achieved, accordingly comparison operations result in no exchange operations anymore. Each cell which did not need to exchange its result with its neighbor will set Exchanged=0 signal. When all cells have Exchange=0 (OR (0,0,0 . . . 0)=0) it indicates to the control logic that the desired sorted order has been achieved.

Figure 7:
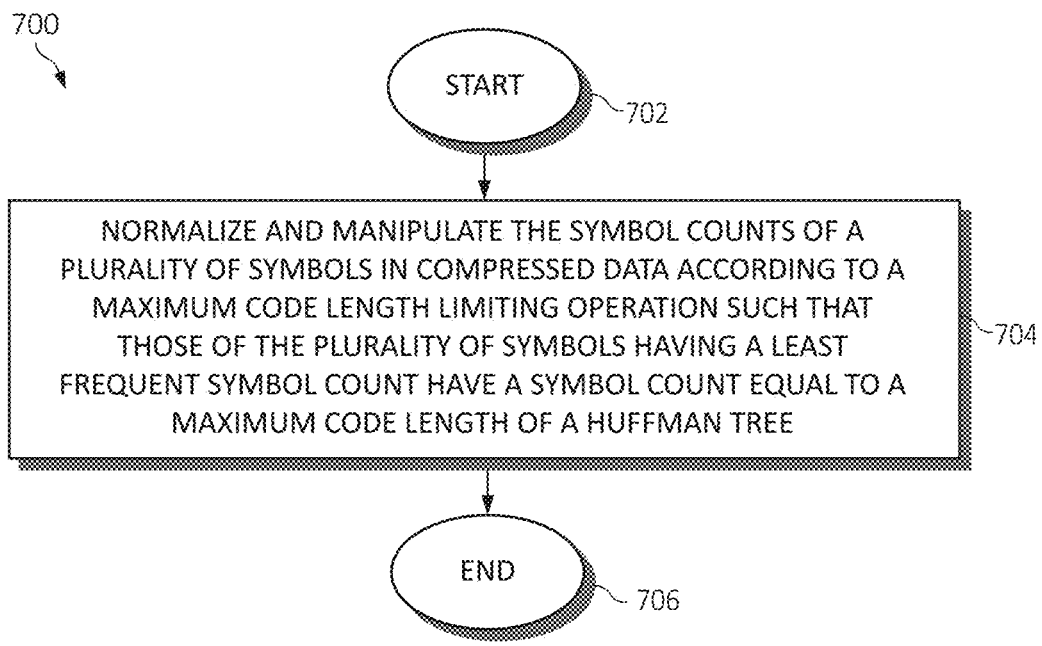
FIG. 7 is a flowchart diagram depicting an exemplary method for providing length-limited Huffman encoding in a data compression accelerator in a computing system in which aspects of the present invention may be realized.

Turning now to FIG. 7, a method 700 for providing length-limited Huffman encoding in a data compression accelerator is depicted, in which various aspects of the illustrated embodiments may be implemented. The functionality 700 may be implemented as a method executed as instructions on a machine, where the instructions are included on at least one computer readable medium or on a non-transitory machine-readable storage medium. The functionality 700 may start in block 702.

Symbol counts of a plurality of symbols in compressed data may be normalized and manipulated according to a maximum code length limiting operation such that those of the plurality of symbols having a least frequent symbol count have a symbol count equal to a maximum code length of a Huffman tree, as in block 704. The functionality 700 may end in block 706.

In one aspect, in conjunction with and/or as part of at least one block of FIG. 7, the operation of method 700 may include each of the following. The operation of functionality 700 may retain an ordering location in the Huffman tree of those of the plurality of symbols having a higher frequency count as compared to the those of the symbols having a least frequent symbol count. The operation of functionality 700 reassign those of the symbols having the least frequent symbol count to an alternative ordering location in the Huffman tree.

The operation of functionality 700 iteratively execute the maximum code length limiting operation until the symbol count of the least frequent symbol count equals the maximum code length of the Huffman tree. Additionally, the operation of functionality 700 may define the maximum code length limiting operation as setting the maximum code length of the Huffman tree as equal to taking a negative logarithm with base two multiplied by a minimum probability, wherein the minimum probability is equal to a total symbol count divided by a smallest symbol count, where in the maximum code length of the Huffman tree is equal to 15 bits.

The operation of functionality 700 may determine a number of the symbol counts in the compressed data, sort, in parallel, the symbol counts in an ascending order of a two dimensional ("2D") mesh, wherein the 2D mesh stores both a symbol and a count as a pair. The operation of functionality 700 store the symbol counts in a two dimensional ("2D") mesh table having a symbol and a corresponding symbol count as a pair, sort each row of the 2D mesh table according to a first sorting order, wherein the sorting is completed in N cycles, and/or sort each column of the 2D mesh table according to a second sorting order, wherein the sorting is completed in M cycles.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowcharts and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowcharts and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowcharts and/or block diagram block or blocks.

The flowcharts and block diagrams in the Figures illustrate the architecture, functionality, and operation of possible implementations of systems, methods, and computer program products according to various embodiments of the present invention. In this regard, each block in the flowcharts or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts or carry out combinations of special purpose hardware and computer instructions.

The invention claimed is:

1. A method, by a processor, for length-limited Huffman encoding in a data compression accelerator, comprising:
normalizing and manipulating symbol counts of a plurality of symbols in compressed data according to a maximum code length limiting operation such that those of the plurality of symbols having a least frequent symbol count have a symbol count equal to a maximum code length of a Huffman tree.

2. The method of claim 1, further including retaining an ordering location in the Huffman tree of those of the plurality of symbols having a higher frequency count as compared to the those of the symbols having a least frequent symbol count.

3. The method of claim 1, further including reassigning those of the symbols having the least frequent symbol count to an alternative ordering location in the Huffman tree.

4. The method of claim 1, further including iteratively executing the maximum code length limiting operation until the symbol count of the least frequent symbol count equals the maximum code length of the Huffman tree.

5. The method of claim 1, further including defining the maximum code length limiting operation as setting the maximum code length of the Huffman tree as equal to taking a negative logarithm with base two multiplied by a minimum probability, wherein the minimum probability is equal to a total symbol count divided by a smallest symbol count, where in the maximum code length of the Huffman tree is equal to 15 bits.

6. The method of claim 1, further including:
determining a number of the symbol counts in the compressed data;
sorting, in parallel, the symbol counts in an ascending order of a two dimensional ("2D") mesh, wherein the 2D mesh stores both a symbol and a count as a pair.

7. The method of claim 6, further including:
storing the symbol counts in a two dimensional ("2D") mesh table having a symbol and a corresponding symbol count as a pair;
sorting each row of the 2D mesh table according to a first sorting order, wherein the sorting is completed in N cycles; and
sorting each column of the 2D mesh table according to a second sorting order, wherein the sorting is completed in M cycles.

8. A system for length-limited Huffman encoding in a data compression accelerator, comprising:
one or more computers with executable instructions that when executed cause the system to:
normalize and manipulate symbol counts of a plurality of symbols in compressed data according to a maximum code length limiting operation such that those of the plurality of symbols having a least frequent symbol count have a symbol count equal to a maximum code length of a Huffman tree.

9. The system of claim 8, wherein the executable instructions retain an ordering location in the Huffman tree of those of the plurality of symbols having a higher frequency count as compared to the those of the symbols having a least frequent symbol count.

10. The system of claim 8, wherein the executable instructions reassign those of the symbols having the least frequent symbol count to an alternative ordering location in the Huffman tree.

11. The system of claim 8, wherein the executable instructions iteratively execute the maximum code length limiting operation until the symbol count of the least frequent symbol count equals the maximum code length of the Huffman tree.

12. The system of claim 8, wherein the executable instructions define the maximum code length limiting operation as setting the maximum code length of the Huffman tree as equal to taking a negative logarithm with base two multiplied by a minimum probability, wherein the minimum probability is equal to a total symbol count divided by a smallest symbol count, where in the maximum code length of the Huffman tree is equal to 15 bits.

13. The system of claim 8, wherein the executable instructions:
  determine a number of the symbol counts in the compressed data;
  sort, in parallel, the symbol counts in an ascending order of a two dimensional ("2D") mesh, wherein the 2D mesh stores both a symbol and a count as a pair.

14. The system of claim 8, wherein the executable instructions:
  store the symbol counts in a two dimensional ("2D") mesh table having a symbol and a corresponding symbol count as a pair;
  sort each row of the 2D mesh table according to a first sorting order, wherein the sorting is completed in N cycles; and
  sort each column of the 2D mesh table according to a second sorting order, wherein the sorting is completed in M cycles.

15. A computer program product for providing length-limited Huffman encoding in a data compression accelerator by a processor, the computer program product comprising a non-transitory computer-readable storage medium having computer-readable program code portions stored therein, the computer-readable program code portions comprising:
  an executable portion that normalizes and manipulates symbol counts of a plurality of symbols in compressed data according to a maximum code length limiting operation such that those of the plurality of symbols having a least frequent symbol count have a symbol count equal to a maximum code length of a Huffman tree.

16. The computer program product of claim 15, further including an executable portion that:
  retains an ordering location in the Huffman tree of those of the plurality of symbols having a higher frequency count as compared to the those of the symbols having a least frequent symbol count; or
  reassigns those of the symbols having the least frequent symbol count to an alternative ordering location in the Huffman tree.

17. The computer program product of claim 15, further including an executable portion that iteratively executes the maximum code length limiting operation until the symbol count of the least frequent symbol count equals the maximum code length of the Huffman tree.

18. The computer program product of claim 15, further including an executable portion that defines the maximum code length limiting operation as setting the maximum code length of the Huffman tree as equal to taking a negative logarithm with base two multiplied by a minimum probability, wherein the minimum probability is equal to a total symbol count divided by a smallest symbol count, where in the maximum code length of the Huffman tree is equal to 15 bits.

19. The computer program product of claim 15, further including an executable portion that:
  determines a number of the symbol counts in the compressed data;
  sorts, in parallel, the symbol counts in an ascending order of a two dimensional ("2D") mesh, wherein the 2D mesh stores both a symbol and a count as a pair.

20. The computer program product of claim 15, further including an executable portion that:
  stores the symbol counts in a two dimensional ("2D") mesh table having a symbol and a corresponding symbol count as a pair;
  sorts each row of the 2D mesh table according to a first sorting order, wherein the sorting is completed in N cycles; and
  sorts each column of the 2D mesh table according to a second sorting order, wherein the sorting is completed in M cycles.

* * * * *